United States Patent
Huang et al.

[11] Patent Number: 6,100,787
[45] Date of Patent: Aug. 8, 2000

[54] MULTILAYER CERAMIC PACKAGE WITH LOW-VARIANCE EMBEDDED RESISTORS

[75] Inventors: Rong-Fong Huang; Robert A. Burr, both of Albuquerque, N. Mex.

[73] Assignee: Motorola, Inc., Schaumburg, Ill.

[21] Appl. No.: 08/864,300

[22] Filed: May 28, 1997

[51] Int. Cl.[7] ....................................... H01C 7/18
[52] U.S. Cl. ........................ 338/204; 338/310; 338/320
[58] Field of Search ...................... 338/310, 311, 338/314, 319, 320, 239, 204, 252, 253, 254, 260; 174/261; 29/830

[56] References Cited

U.S. PATENT DOCUMENTS

| | | |
|---|---|---|
| 4,298,786 | 11/1981 | Marciniec . |
| 4,310,571 | 1/1982 | Daniele et al. . |
| 4,468,414 | 8/1984 | Van Vonno . |
| 4,486,738 | 12/1984 | Sadlo et al. ............................. 338/320 |
| 4,554,732 | 11/1985 | Sadlo et al. . |
| 4,567,542 | 1/1986 | Shimada et al. . |
| 4,732,798 | 3/1988 | Ishida et al. . |
| 4,735,676 | 4/1988 | Iwasa . |
| 4,812,419 | 3/1989 | Lee et al. . |
| 4,962,365 | 10/1990 | Havemann et al. . |
| 5,027,253 | 6/1991 | Lauffer et al. . |
| 5,164,699 | 11/1992 | Smith et al. ............................. 338/310 |
| 5,292,624 | 3/1994 | Wei . |
| 5,362,927 | 11/1994 | Ezaki ...................................... 174/261 |
| 5,371,029 | 12/1994 | Abdo et al. . |
| 5,600,101 | 2/1997 | Sakai . |

*Primary Examiner*—Renee S. Luebke
*Assistant Examiner*—Richard K. Lee
*Attorney, Agent, or Firm*—Gary J. Cunningham

[57] ABSTRACT

A multilayer electronic component (200) is provided. The component includes a substrate package assembly (202) with a set of stacked insulated sheets of a dielectric ceramic material (204, 206, 208, 210, 212). Also included are a set of embedded resistors (214), each of the embedded resistors including an electrical input port pad (216) and an electrical output port pad (218) provided in layers between the set of stacked insulated sheets. Each of the insulated sheets has a trough (220) of a predetermined length aligned between and transverse to the electrical input port pad (216) and the electrical output port pad (218). The trough (220) reduces the resistance value variability in the multilayer electronic component (200). The trough (220) is substantially filled with a resistive paste material and an internal circuit (222) connects the embedded resistors inside the substrate package assembly (202). A method of forming the substrate package assembly (202) is also provided.

5 Claims, 3 Drawing Sheets

MULTILAYER CERAMIC PACKAGE WITH LOW-VARIANCE EMBEDDED RESISTORS

FIELD OF THE INVENTION

This invention relates to multilayer ceramic packages and, in particular, to a multilayer ceramic package with low-variance embedded resistors and a method of making same.

BACKGROUND OF THE INVENTION

The use of embedded resistors inside of multilayer ceramic packages is well known in the art. Typically, resistors are formed when thin layers of resistive paste are deposited between dielectric sheets of green ceramic tape. After lamination and firing, the embedded resistors are then formed inside the multilayer package. Embedded resistors may be used for biasing, voltage dividing, and termination applications. A major problem associated with conventional screen-printing of resistive paste on ceramic substrates to form resistors is that there is an unacceptable amount of variability in the resistance values in a fired package. This is in part due to the fact that a single layer of resistive paste is merely about 0.3 mils thick and can vary substantially depending upon processing techniques. Screen printing processing variability may be caused by a variety of factors such as uneven fixturing, uneven squeegee blade or stroke, non-uniform viscosity of the paste composition, or other factors. As such, a fluctuation in the thickness of the printed film can result in a corresponding fluctuation in the amount of resistive paste deposited which necessarily effects resistance values in the resulting resistors.

It is not unusual to find resistance values that vary by as much as 30% from one multilayer ceramic package to another, although typically desirable resistance values may vary by about 10%. Obviously, this is unacceptable for any large-scale manufacturing process and also presents challenges to a designer designing the circuitry inside of multilayer packages.

Another problem with traditional resistor fabrication techniques is that the resistors require trimming as an additional processing step in order to achieve their desired resistance values. When resistors are embedded deep inside a multilayer ceramic package, they are not normally trimmable.

Consequently, many designs employ simple configurations in which the resistor is placed on a top layer so that it may be trimmed in an easily accessible manner. However, by placing resistors on the top layer, the top surface of the package leaves little room for other components such as integrated circuit packages or other components.

FIG. 1 shows a multilayer ceramic package with resistors in accordance with the prior art. Referring to FIG. 1, a multilayer assembly 100 is provided with vertically stacked sheets of a dielectric material 102 which are placed on top of a base substrate 101. Base substrate 101 may be either a single layer or a multilayer substrate package. Conductive layers 104 are positioned between the stacked sheets of dielectric material 102 to provide internal components. Resistors 106 are formed on a top surface 105 of the multilayer ceramic package. Significantly, the resistors 106 are formed from a very thin layer of resistive paste material, typically about 0.3 mils or less. Moreover, these resistors 106 are positioned so as to be easily accessible for a subsequent trimming operation.

A feature of a ceramic multilayer package that could reduce the resistance value variability to about ten percent or less while remaining susceptible to conventional multilayer processing techniques and which simultaneously created embedded co-firable resistors which did not require trimming to achieve their desired electrical characteristics would be considered an improvement in the art.

DETAILED DESCRIPTION OF THE PREFERRED EMBODIMENT

Figure 1:
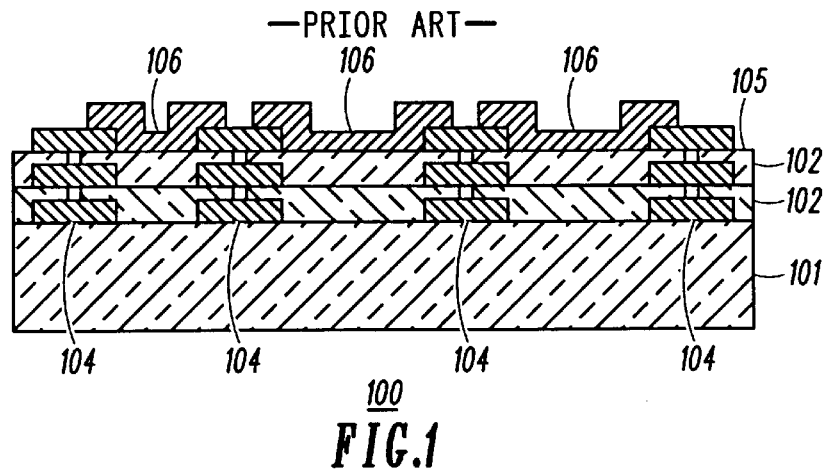
FIG. 1 shows a multilayer ceramic package with resistors in accordance with the prior art.
Figure 2:
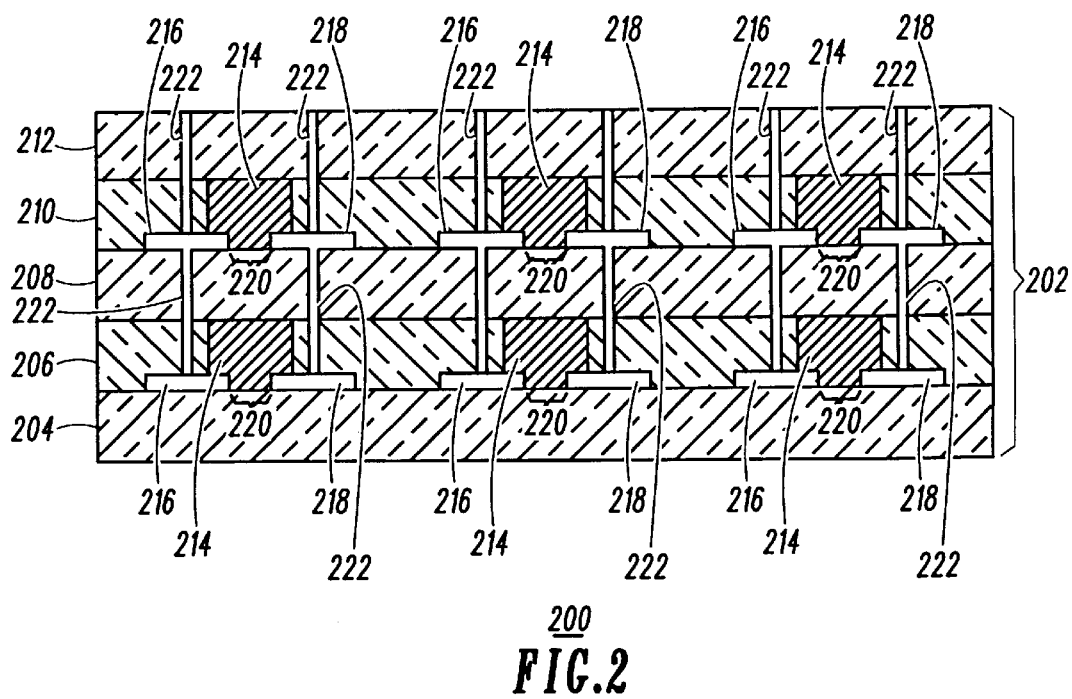
FIG. 2 shows a cross-sectional view of a multilayer ceramic package with embedded resistors in accordance with the present invention.

FIG. 2 shows a cross-sectional view of a multilayer ceramic package with embedded resistors in accordance with one embodiment of the present invention. Referring to FIG. 2, a multilayer electronic component 200 is provided. Component 200 is made from a substrate package assembly 202 comprising a plurality of stacked insulated sheets of a dielectric ceramic material numbered 204, 206, 208, 210 and 212 respectively.

A plurality of embedded resistors 214 are provided inside the substrate package assembly 202. Each of the embedded resistors 214 comprises an electrical input port pad 216 and an electrical output port pad 218 provided in predetermined layers between the plurality of stacked insulated sheets (204 and 206, 208 and 210). Sheets 206 and 210 have a trough 220 of a predetermined length aligned between and transverse to the electrical input port pad 216 and the electrical output port pad 218.

In FIG. 2, the troughs 220 include a narrow area between the electrical input port pad and the electrical output port pad as well as a wider area atop the pads. The trough 220 length is shown as the entire darkened region in component 200 in FIG. 2. The troughs 220 are substantially filled with a resistive paste material and provide a substantially uniform electrical resistance value across the electrical input port pad 216 and the electrical output port pad 218. Also shown in FIG. 2 is an internal circuit 222 connecting the embedded resistors inside the substrate package assembly 202.

When a resistor is formed inside a multilayer package, it is oftentimes formed with a single layer of resistive paste which is screen-printed onto a ceramic substrate using a thick film deposition technique. Typically, the resulting resistive paste layer will be only 0.3 mils (0.0003 inches) thick. This is in stark contrast to the present invention which fills an entire trough 220 with a resistive material. The trough will have the same thickness of at least one sheet in the package, which may be about 3–10 mils (0.003–0.010 inches) before firing.

By filling the trough entirely with a resistive paste material, the variance in the resistance values for the embedded resistors is reduced. The inventors postulate that this can be explained by the fact that as the trough is filled with a resistive paste material, a change in the actual amount of resistive paste which forms the resistor will have less of an effect on the resistance values of the final resistor. In other words, a process variable, such as a slight thickness variation in the resistive paste due to uneven paste deposition, will have a much greater effect on the resistance value of an embedded resistor made from a layer 0.3 mils thick than it will on the resistance value of an embedded resistor made from a layer which is 10 mils thick. Stated another way, as a layer of resistive paste is built up in the trough, a change in the fill level will have less of an effect on the overall resistance values of the resistor.

In a preferred embodiment, the troughs 220 will be filled with resistive paste using conventional screen-printing techniques. Moreover, the troughs will be punched into the green ceramic tape using conventional tape-punching techniques. Of course, the troughs may also be created using lasers, hard-tool drilling equipment or other techniques and filled using injection, syringe, via filling, or other techniques.

Figure 3:
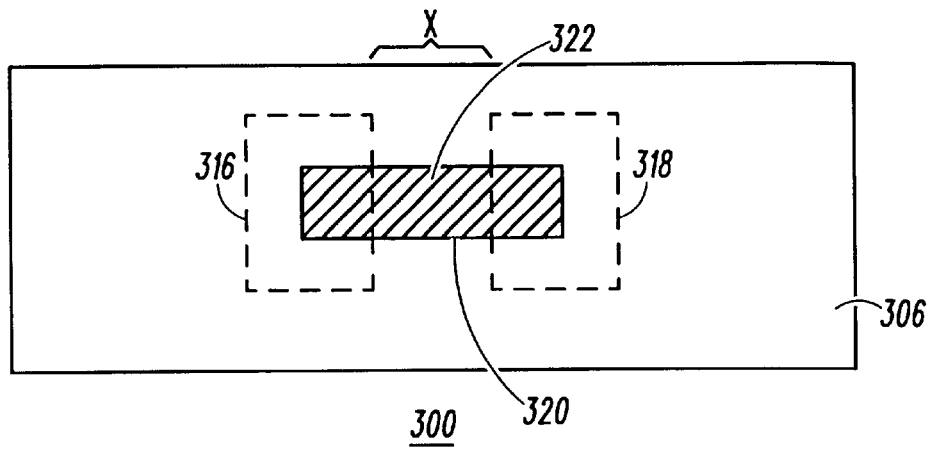
FIG. 3 shows a top view of a trough and a resistor pad layout of the multilayer package in accordance with the present invention.

FIG. 3 shows a top view (plan view) of a trough 320 as it is positioned over an electrical input port pad 316 and an electrical output port pad 318. Referring to FIG. 3, the relationship between the trough and resistor pad layout of the multilayer package is provided.

A top view of an embedded resistor 300 is shown in FIG. 3. A sheet of dielectric green ceramic dielectric material 306 is provided having a trough 320 punched into it to reduce the variability of the resistance values of the embedded resistor 300. The electrical input port pad 316 and the electrical output port pad 318 are shown in phantom as dashed lines in FIG. 3.

From this view, various important aspects of the trough design can be seen. In a preferred embodiment, it is important that the trough be narrower than the input and output pads. In a preferred embodiment, the trough should also not extend past the edges of the resistor pads. These parameters have been established after the evaluation of numerous alternative designs. The spacing between the input and output pads is another important parameter, and is designated by the letter "x" in FIG. 3. In TABLE 1 (discussed below), various "x" values were evaluated (0.010", 0.020", 0.030") to show that resistance value variability was reduced over a range of different possible designs. Finally, a resistive paste material 322 is used to fill the trough and provide the framework for the embedded resistors.

Many different resistor pastes may be used for the design of the present invention. One typical resistor paste is a $RuO_2$ material. However, any paste which is readily screen-printed or stenciled and which may be formulated to the proper viscosity and firing temperatures may be used with the trough design of the present invention.

The trimming of resistors is a well-known process whereby a selective portion of resistive material is removed from the resistor to control its resistance value. This may be accomplished through the use of lasers or other precision trimming devices. However, the resistor device must be easily accessible in order to be properly trimmed.

An important advantage of the present invention is that the trough feature allows for the creation of precise, tight tolerance embedded resistors. In a preferred embodiment of the present invention, all resistance value parameters are controlled by the dimensions of the trough and, in certain instances, no trimming may be required. Thus, resistors may be embedded many layers deep into a multilayer package providing substantial flexibility for a multilayer package designer.

When designing tight tolerance resistors to be embedded inside a multilayer package, the seminal design formula will be:

$$R = \rho \frac{X}{wt} \tag{1.0}$$

Where:

R=the desired resistance measured in ohms;

$\rho$=the resistivity of the paste material;

X=the distance between the input port pad and the output port pad measured in mils;

w=the width of the trough measured in mils; and t=the thickness of the sheet of ceramic which forms the trough measured in mils.

The above equation may be used to determine the precise dimensions that will be required for a trough in order to provide an embedded resistor when the final resistance value and resistivity of the paste material is known. Moreover, although the resulting resistor may have variability in the filling thickness of the resistive paste, this will not significantly effect the resistance values in the final resistor component.

Figure 4A:
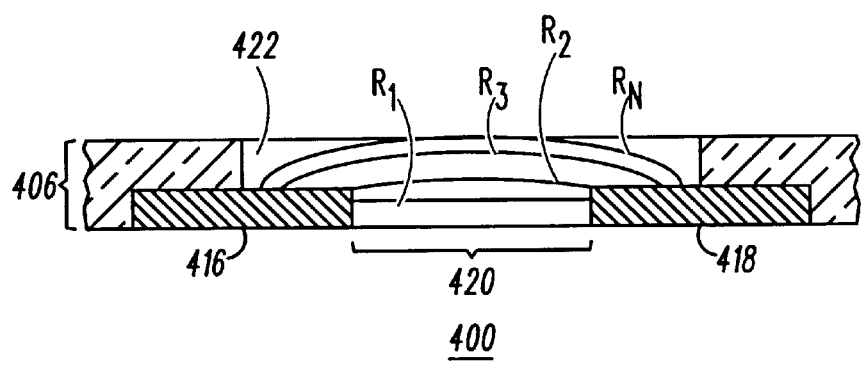
FIG. 4A shows an enlarged view of an embedded resistor in accordance with the present invention.

FIG. 4A shows an enlarged view of an embedded resistor 400 in accordance with the present invention. FIG. 4A shows a sheet of dielectric green ceramic material 406 having a trough 420 punched therein. Also shown in FIG. 4A are an electrical input port pad 416 and an electrical output port pad 418 which form part of the embedded resistor 400. The resistive paste material 422 is also provided in FIG. 4A. The resistance paths between the electrical input port pad 416 and the electrical output port pad 418 are shown as solid lines labeled $R_1$ through $R_N$ respectively. It is important to note that as the resistive paste 422 fills the trough 420, the paths become increasingly longer in length.

Figure 4B:
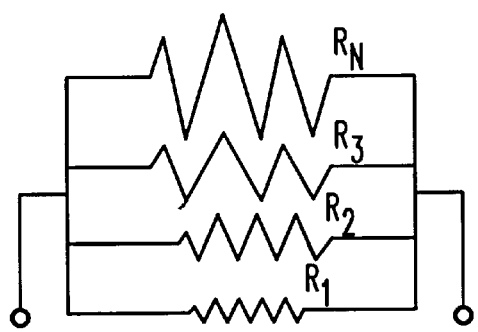
FIG. 4B shows an approximation of the resistance values for the various paths between the resistor pads of FIG. 4A in accordance with the present invention.

FIG. 4B is related to FIG. 4A and shows an approximation of the resistance values ($R_1, R_2, R_3, R_N$) for the various paths between the resistor pads 416 and 418 of FIG. 4A. Since the electrical path length of $R_N$ is much greater than that of $R_1$, the schematic of FIG. 4B shows the resistance value $R_N$ to be much larger than $R_1$. For this reason, the effect of process variation on a substantially filled trough ($R_N$) has a much lesser effect on the resistance values of an embedded resistor than a process variation on a thin film of resistive paste ($R_1$). This aspect of the invention will be discussed further using equation (2.0) below.

Figure 5:
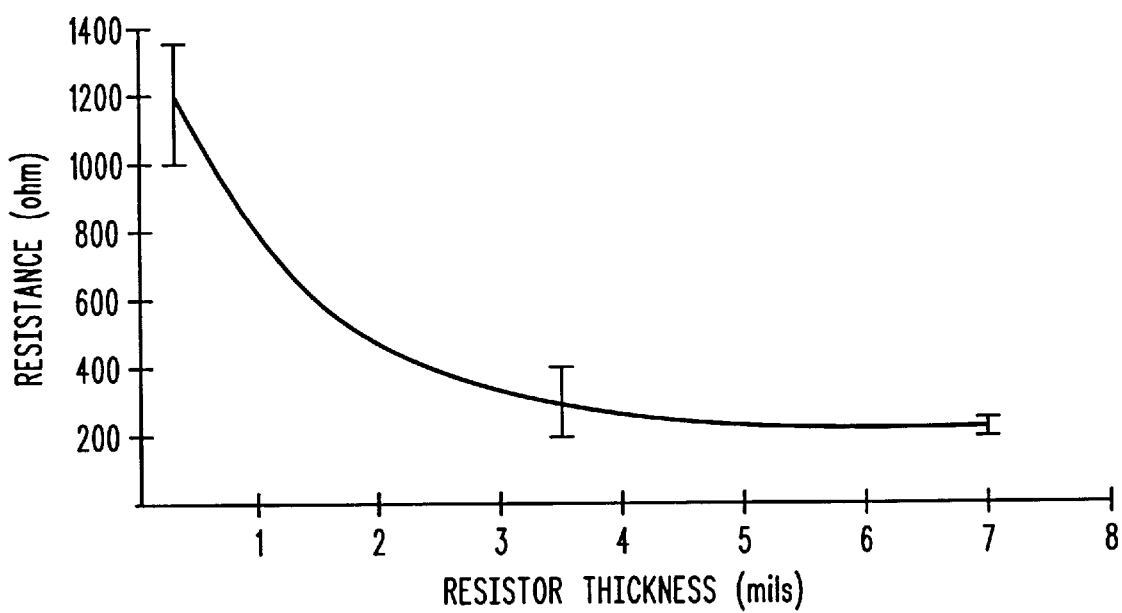
FIG. 5 shows a graph of the effect of resistor paste thickness on resistance variation in accordance with the present invention.

FIG. 5 shows a graph of the effect of resistor paste thickness on resistance variation in accordance with the present invention. The actual data from TABLE 1 (shown below) shows the desirable low resistance variability values when the trough thickness is 7 mils. Other samples were also taken where the trough thickness was approximately 1 and 3 mils. However, the resistance variability values for these samples was unacceptably large as is shown in FIG. 5.

TABLE 1 shows the Resistance Values for Embedded Resistors with a 7 mil thick Trough for 480 sample troughs tested on 4 separate substrates. The actual test data results are shown in TABLE 1 below:

TABLE 1

Resistance Values for Embedded Resistors with 7 mil thick trough
Each substrate (1, 2, 3, & 4) consisted sf four strategically placed columns (1 thru 4), with each column having various distances between the electrical input port pad and the electrical output port pad (X = 10, 20, and 30 mils).
Resistance measured in Ohms

Substrate #1

| X in mils | Column 1 | | | Column 2 | | | Column 3 | | | Column 4 | | |
|---|---|---|---|---|---|---|---|---|---|---|---|---|
| | 10 | 20 | 30 | 10 | 20 | 30 | 10 | 20 | 30 | 10 | 20 | 30 |
| | 306 | 452 | 594 | 305 | 452 | 609 | 303 | 452 | 592 | 289 | 475 | 614 |
| | 300 | 449 | 593 | 260 | 477 | 606 | 305 | 437 | 591 | 290 | 482 | 618 |
| | 296 | 446 | 597 | 290 | 439 | 599 | 285 | 441 | 590 | 289 | 459 | 620 |
| | 288 | 454 | 600 | 283 | 438 | 596 | 289 | 431 | 585 | 279 | 466 | 628 |
| | 288 | 441 | 599 | 293 | 443 | 599 | 277 | 439 | 596 | 291 | 454 | 626 |
| | 290 | 441 | 579 | 292 | 437 | 588 | 281 | 434 | 592 | 281 | 455 | 629 |
| | 297 | 447 | 582 | 292 | 443 | 592 | 280 | 434 | 585 | 285 | 463 | 632 |
| | 300 | 441 | 604 | 284 | 441 | 610 | 290 | 432 | 585 | 288 | 464 | 620 |
| | 286 | 447 | 595 | 295 | 459 | 604 | 289 | 432 | 591 | 302 | 466 | 639 |
| | 293 | 454 | 606 | 289 | 444 | 606 | 286 | 444 | 606 | 301 | 470 | 625 |
| Average | 294.40 | 447.20 | 594.90 | 290.30 | 447.30 | 600.90 | 288.50 | 437.60 | 591.30 | 289.50 | 465.40 | 825.10 |
| Standard Dev. | 6.50 | 5.12 | 8.67 | 7.09 | 12.43 | 7.36 | 9.22 | 6.62 | 6.33 | 7.43 | 8.67 | 7.39 |
| Percent Diff. | 2.21 | 1.14 | 1.46 | 2.44 | 2.78 | 1.22 | 3.19 | 1.51 | 1.07 | 2.57 | 1.86 | 1.18 |

| | Column Totals | | |
|---|---|---|---|
| | 10 mils | 20 mils | 30 mils |
| | 290.66 | 449.38 | 603.05 |
| | 7.67 | 13.15 | 15.16 |
| | 2.64 | 2.93 | 2.51 |

Substrate #2

| X in mils | Column 1 | | | Column 2 | | | Column 3 | | | Column 4 | | |
|---|---|---|---|---|---|---|---|---|---|---|---|---|
| | 10 | 20 | 30 | 10 | 20 | 30 | 10 | 20 | 30 | 10 | 20 | 30 |
| | 301 | 444 | 608 | 301 | 450 | 605 | 301 | 442 | 586 | 278 | 446 | 620 |
| | 300 | 446 | 603 | 290 | 471 | 598 | 296 | 435 | 584 | 281 | 445 | 610 |
| | 294 | 455 | 610 | 287 | 456 | 601 | 290 | 426 | 588 | 296 | 437 | 600 |
| | 283 | 455 | 595 | 284 | 434 | 607 | 292 | 433 | 554 | 282 | 480 | 599 |
| | 297 | 439 | 570 | 286 | 440 | 581 | 289 | 435 | 592 | 298 | 446 | 600 |
| | 295 | 458 | 513 | 280 | 445 | 580 | 285 | 434 | 611 | 286 | 451 | 604 |
| | 288 | 444 | 605 | 278 | 438 | 598 | 303 | 438 | 611 | 281 | 442 | 611 |
| | 290 | 450 | 597 | 286 | 449 | 595 | 269 | 460 | 603 | 284 | 475 | 608 |
| | 277 | 447 | 606 | 302 | 446 | 606 | 294 | 434 | 596 | 299 | 471 | 611 |
| | 293 | 446 | 608 | 288 | 463 | 611 | 288 | 453 | 586 | 294 | 468 | 618 |
| Average | 291.67 | 448.80 | 801.50 | 288.20 | 449.20 | 598.00 | 292.70 | 439.00 | 591.10 | 287.90 | 454.10 | 606.10 |
| Standard Dev. | 7.97 | 5.87 | 12.38 | 7.87 | 11.46 | 10.53 | 5.81 | 10.19 | 16.49 | 7.99 | 13.39 | 7.39 |
| Percent Diff. | 2.73 | 1.31 | 2.06 | 2.73 | 2.55 | 1.76 | 1.99 | 2.32 | 2.79 | 2.78 | 2.95 | 1.21 |

| | Column Totals | | |
|---|---|---|---|
| | 10 mils | 20 mils | 30 mils |
| | 290.15 | 447.78 | 599.68 |
| | 7.39 | 11.59 | 13.22 |
| | 2.55 | 2.59 | 2.21 |

TABLE 1-continued

Resistance Values for Embedded Resistors with 7 mil thick trough
Each substrate (1, 2, 3, & 4) consisted of four strategically placed columns (1 thru 4), with each column having
various distances between the electrical input port pad and the electrical output port pad (X = 10, 20, and 30 mils).
Resistance measured in Ohms

Substrate #3

| X in mils | Column 1 | | | Column 2 | | | Column 3 | | | Column 4 | | | Column Totals | | |
|---|---|---|---|---|---|---|---|---|---|---|---|---|---|---|---|
| | 10 | 20 | 30 | 10 | 20 | 30 | 10 | 20 | 30 | 10 | 20 | 30 | 10 mils | 20 mils | 30 mils |
| | 319 | 475 | 621 | 313 | 486 | 631 | 312 | 480 | 636 | 321 | 466 | 635 | | | |
| | 305 | 449 | 598 | 289 | 485 | 634 | 309 | 473 | 638 | 307 | 479 | 639 | | | |
| | 300 | 478 | 627 | 302 | 459 | 636 | 312 | 484 | 637 | 311 | 491 | 610 | | | |
| | 315 | 461 | 646 | 308 | 472 | 625 | 311 | 473 | 637 | 311 | 478 | 635 | | | |
| | 302 | 479 | 629 | 288 | 455 | 638 | 293 | 490 | 624 | 318 | 493 | 634 | | | |
| | 309 | 473 | 636 | 290 | 466 | 605 | 292 | 458 | 619 | 308 | 480 | 629 | | | |
| | 316 | 453 | 595 | 303 | 457 | 601 | 291 | 445 | 825 | 320 | 497 | 644 | | | |
| | 309 | 484 | 629 | 311 | 492 | 610 | 300 | 467 | 632 | 321 | 503 | 620 | | | |
| | 296 | 454 | 605 | 313 | 492 | 628 | 304 | 453 | 638 | 322 | 483 | 638 | | | |
| | 296 | 472 | 598 | 309 | 471 | 614 | 311 | 470 | 638 | 317 | 492 | 646 | | | |
| Average | 306.70 | 467.80 | 618.40 | 302.60 | 470.00 | 622.20 | 303.50 | 469.30 | 832.40 | 315.60 | 486.20 | 633.00 | 307.10 | 473.33 | 626.50 |
| Standard Dev. | 8.27 | 12.46 | 18.06 | 10.08 | 13.62 | 13.58 | 8.81 | 14.05 | 7.11 | 5.78 | 10.94 | 10.92 | 9.59 | 14.48 | 14.08 |
| Percent Diff. | 2.70 | 2.66 | 2.92 | 3.33 | 2.90 | 2.18 | 2.90 | 2.99 | 1.12 | 1.83 | 2.25 | 1.73 | 3.12 | 3.06 | 2.25 |

Substrate #4

| X in mils | Column 1 | | | Column 2 | | | Column 3 | | | Column 4 | | | Column Totals | | |
|---|---|---|---|---|---|---|---|---|---|---|---|---|---|---|---|
| | 10 | 20 | 30 | 10 | 20 | 30 | 10 | 20 | 30 | 10 | 20 | 30 | 10 mils | 20 mils | 30 mils |
| | 313 | 450 | 622 | 297 | 460 | 608 | 307 | 449 | 636 | 294 | 449 | 631 | | | |
| | 311 | 451 | 612 | 293 | 480 | 634 | 305 | 453 | 627 | 292 | 436 | 610 | | | |
| | 312 | 483 | 620 | 306 | 457 | 627 | 301 | 461 | 608 | 305 | 439 | 627 | | | |
| | 292 | 457 | 605 | 299 | 456 | 610 | 301 | 464 | 624 | 292 | 474 | 599 | | | |
| | 298 | 471 | 614 | 306 | 455 | 614 | 296 | 452 | 619 | 306 | 463 | 611 | | | |
| | 310 | 452 | 613 | 303 | 449 | 630 | 297 | 476 | 607 | 296 | 457 | 609 | | | |
| | 307 | 467 | 594 | 301 | 487 | 608 | 295 | 443 | 618 | 314 | 441 | 612 | | | |
| | 297 | 482 | 625 | 305 | 452 | 603 | 302 | 486 | 639 | 296 | 459 | 632 | | | |
| | 306 | 462 | 625 | 295 | 477 | 630 | 301 | 458 | 640 | 310 | 449 | 615 | | | |
| | 302 | 470 | 616 | 298 | 460 | 606 | 291 | 460 | 623 | 295 | 475 | 636 | | | |
| Average | 305.11 | 464.80 | 614.60 | 300.30 | 463.30 | 617.00 | 299.60 | 458.20 | 624.10 | 300.00 | 454.20 | 618.20 | 301.18 | 450.05 | 618.48 |
| Standard Dev. | 7.59 | 12.20 | 9.59 | 4.64 | 13.10 | 11.85 | 4.84 | 9.45 | 11.74 | 8.01 | 13.84 | 12.34 | 6.46 | 12.50 | 11.54 |
| Percent Diff. | 2.49 | 2.63 | 1.56 | 1.55 | 2.83 | 1.92 | 1.61 | 2.06 | 1.88 | 2.67 | 3.05 | 2.00 | 2.15 | 2.72 | 1.87 |

TABLE 1-continued

Resistance Values for Embedded Resistors with 7 mil thick trough
Each substrate (1, 2, 3, & 4) consisted of four strategically placed columns (1 thru 4), with each column having
various distances between the electrical input port pad and the electrical output port pad (X = 10, 20, and 30 mils).
Resistance measured in Ohms

| | ALL Column Totals | | |
|---|---|---|---|
| | 10 mils | 20 mils | 30 mils |
| Average | 297.28 | 457.53 | 611.93 |
| Standard Dev. | 10.60 | 16.43 | 17.39 |
| Percent Diff. | 3.57 | 3.59 | 2.84 |

Analysis of the data provided in TABLE 1 shows that 480 samples were provided. Each sample consisted of an embedded trough resistor whose resistance values were measured. Four different substrates were tested (Substrates numbered 1 through 4 in TABLE 1). Additionally, each substrate was tested at four strategically placed locations on the surface of the substrate (Columns 1 through 4 in TABLE 1). This was done to see if results could be repeated at various sites on a single substrate. Moreover, at each location (Column 1 through 4), three different gap spacings (X=10, 20, and 30 mils) were measured. From this data, average resistance values, as well as standard deviation and percent difference values were calculated.

Over all four substrates, the 160 samples of embedded resistors with a 10 mil gap between the electrical input port pad and the electrical output port pad had an average resistance value of 297.28 ohms with a standard deviation of only 10.60 ohms. Significantly, the percent difference was only 3.57%.

The 160 samples of embedded resistors with a 20 mil gap between the electrical input port pad and the electrical output port pad had an average resistance value of 457.63 ohms with a standard deviation of only 16.43 ohms. Significantly, the percent difference was only 3.59%.

The 160 samples of embedded resistors with a 30 mil gap between the electrical input port pad and the electrical output port pad had an average resistance value of 611.93 ohms with a standard deviation of only 17.39 ohms. Significantly, the percent difference was only 2.84 %.

An important result from this research is that by forming troughs in the packages, resistance value variability was reduced to less than 4%, which is acceptable for certain large scale manufacturing operations and processes. The inventors believe that resistance value variability will remain low with the introduction of the trough, regardless of the distance between the electrical input port pad and the electrical output port pad and regardless of the actual resistivity values of the paste itself. Thus, the introduction of a trough to form embedded resistors provides a novel method to control resistance value variability in embedded resistors in multilayer ceramic packages.

TABLE 1 shows that the resistance variation over multiple samples is less than 4%, which is acceptable for large-scale manufacturing operations. A significant challenge in the processing of multilayer products involves the uniform deposition of paste materials over the surface of the ceramic substrates. While a certain amount of variability is inevitable, TABLE 1 shows that despite processing variables, numerous samples taken from various locations on the substrate surface still provided relatively uniform resistance values.

From the graph shown in FIG. 5 it can be seen that resistance values, measured in ohms, decreased with increasing resistor thickness. However, the noteworthy part of this graph involves the variability of the resistance values for the various sample sets that were measured. Whereas when the trough was only filled slightly, for example, less than about one mil resistor thickness, the variability of the resistance values, in ohms, varied considerably, over 200 ohms. However, when the trough was filled to a higher level, namely about 3–4 mils, the variability of the resistance values measured in ohms did not change as much, less than 100 ohms. Moreover, when the trough was substantially filled entirely, the resistance values, measured in ohms, varied less than 50 ohms from sample to sample.

The inventors postulate that this can be explained by the fact that as the thickness of the resistive paste increases, the effect of process variability becomes less and less significant. This may also be expressed in the form of an equation:

$$\frac{1}{R_{total}} = \frac{1}{R_1} + \frac{1}{R_2} + \frac{1}{R_3} + \ldots \frac{1}{R_N} \qquad (2.0)$$

where $R_3 >> R_N$ and where
$R_1$ through $R_N$ are the resistance values for successively thick layers of resistance paste and where $R_{total}$ is the resistance, measured in ohms, of the final embedded resistor component.

Since $R_N$ is much greater than $R_1$, the effect of $R_N$ on the overall resistance value $R_{total}$ is much less than that of $R_1$ due to the inverse relationship expressed in equation (2.0). Consequently, as resistance values around $R_N$ vary due to process variations, their effect on the overall resistance values will be negligible. Thus, the introduction of a trough has the effect of reducing variability of resistance values in embedded resistors.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multilayer electronic component, comprising:
    a substrate package assembly comprising a plurality of stacked insulated sheets of a dielectric ceramic material;
    a plurality of horizontally embedded resistors, each of the horizontally embedded resistors defining a resistor formed in only one discrete layer of the substrate package and comprising:
        an electrical input port pad and an electrical output port pad on a single layer of the plurality of stacked insulated sheets;
        a trough having a predetermined length and a predetermined width filled with a resistive paste material and providing a uniform resistance across the electrical input port pad and the electrical output port pad; and
        an internal circuit connecting the plurality of horizontally embedded resistors.

2. The multilayer electronic component of claim 1, wherein the trough comprises at least two of the plurality of stacked insulated sheets.

3. The multilayer electronic component of claim 1, wherein the electrical input port pad and the electrical output port pad define an area which is greater than the trough.

4. The multilayer electronic component of claim 1, wherein the resistive paste material comprises $RuO_2$.

5. The multilayer electronic component of claim 1, wherein the trough has a depth dimension of 7–10 mils.

* * * * *